(12) United States Patent
Ferrant

(10) Patent No.: US 9,479,174 B2
(45) Date of Patent: Oct. 25, 2016

(54) TRISTATE GATE

(71) Applicant: Soitec, Bernin (FR)

(72) Inventor: Richard Ferrant, Esquibien (FR)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 14/364,923

(22) PCT Filed: Dec. 11, 2012

(86) PCT No.: PCT/EP2012/075054
§ 371 (c)(1),
(2) Date: Jun. 12, 2014

(87) PCT Pub. No.: WO2013/087612
PCT Pub. Date: Jun. 20, 2013

(65) Prior Publication Data
US 2014/0340118 A1 Nov. 20, 2014

(30) Foreign Application Priority Data

Dec. 13, 2011 (EP) .................................... 11290575

(51) Int. Cl.
*H03K 19/094* (2006.01)
*H01L 27/088* (2006.01)
*H01L 27/12* (2006.01)

(52) U.S. Cl.
CPC ..... *H03K 19/09429* (2013.01); *H01L 27/0886* (2013.01); *H01L 27/1203* (2013.01); *H03K 19/094* (2013.01); *H03K 19/0941* (2013.01)

(58) Field of Classification Search
CPC ............... H03K 19/009429; H03K 19/00315; H03K 19/00361; H03K 19/0826
USPC .................................................... 326/56–58
See application file for complete search history.

(56) References Cited

U.S. PATENT DOCUMENTS

| | | | |
|---|---|---|---|
| 5,552,723 A * | 9/1996 | Shigehara et al. | 326/86 |
| 6,181,166 B1 | 1/2001 | Krishnamurthy et al. | |
| 6,184,700 B1 * | 2/2001 | Morris | 326/14 |
| 2002/0000864 A1 | 1/2002 | Fujita | |
| 2006/0166415 A1 * | 7/2006 | Afentakis | H01L 27/1214 438/151 |
| 2007/0013413 A1 * | 1/2007 | Chiang et al. | 326/121 |
| 2007/0040584 A1 * | 2/2007 | Ngo | H03K 19/0963 326/98 |
| 2007/0126478 A1 * | 6/2007 | Kapoor | 326/82 |
| 2007/0262793 A1 * | 11/2007 | Kapoor | 326/101 |
| 2011/0222361 A1 | 9/2011 | Mazure et al. | |
| 2011/0242926 A1 | 10/2011 | Mazure et al. | |
| 2011/0242946 A1 * | 10/2011 | Ogasawara et al. | 368/80 |

OTHER PUBLICATIONS

International Search Report for International Application No. PCT/EP2012/075054 dated Feb. 7, 2013, 4 pages.
Choi et al., Improved Current Drivability with Back-Gate Bias for Elevated Source and Drain Structured FD-SOI SiGe MOSFET, Microelectronic Engineering, vol. 86, No. 11, Nov. 1, 2009, pp. 2165-2169.
International Written Opinion for International Application No. PCT/EP2012/075054 dated Feb. 7, 2013, 7 pages.
International Preliminary Report on Patentability for International Application No. PCT/EP2012/075054 dated Jun. 17, 2014, 8 pages.
European Search Report for European Application No. EP11290575 dated Apr. 26, 2012, 3 pages.

* cited by examiner

*Primary Examiner* — Dylan White
(74) *Attorney, Agent, or Firm* — TraskBritt

(57) ABSTRACT

A tristate gate includes an output port and at least two transistors. Each of the transistors has at least a first and a second gate configured such that a high-impedance value (Z) on the output port is set by controlling the threshold voltage of at least one of the transistors.

14 Claims, 4 Drawing Sheets

| | 2010 | 2021 | 2030 | 2020 | 2040 | 2041 | 2042 |
|---|---|---|---|---|---|---|---|
| CTRL | 0/1 | 0/1 | 0/1 | 0/1 | 0/1 | 0/1 | 0/1 |
| ΦB | L | L | H | H | Very L | Very L | H |
| $V_{THP}$ | low | low | high | high | <0 | <0 | high |
| Pchannel | switch on/off | switch on/off | OFF | OFF | depletion | depletion | OFF |
| Φ | L | H | L | H | L | Very H | Very H |
| $V_{THN}$ | high | low | high | low | high | <0 | <0 |
| Nchannel | OFF | switch | OFF | switch | OFF | depletion | depletion |
| OUT | PU/Z | SC/PD | Z | PD | SC | SC | SC |

Fig. 1B

|  | 1010 | 1030 | 1020 | 1011 | 1040 | 1041 | 1042 |
|---|---|---|---|---|---|---|---|
| ΦB | L | L | H | H | Very L | Very L | H |
| $V_{THP}$ | low | low | high | high | <0 | <0 | high |
| Pchannel | switch | switch | OFF | OFF | depletion | depletion | OFF |
| Φ | L | H | L | H | L | Very H | Very H |
| $V_{THN}$ | high | low | high | low | high | <0 | <0 |
| Nchannel | OFF | switch | OFF | switch | OFF | depletion | depletion |
| OUT | PU | $\overline{IN}$ | Z | PD | SC | SC | SC |

| | 2010 | 2021 | 2030 | 2020 | 2040 | 2041 | 2042 |
|---|---|---|---|---|---|---|---|
| CTRL | 0/1 | 0/1 | 0/1 | 0/1 | 0/1 | 0/1 | 0/1 |
| ΦB | L | L | H | H | Very L | Very L | H |
| $V_{THP}$ | low | low | high | high | <0 | <0 | high |
| Pchannel | switch on/off | switch on/off | OFF | OFF | depletion | depletion | OFF |
| Φ | L | H | L | H | L | Very H | Very H |
| $V_{THN}$ | high | low | high | low | high | <0 | <0 |
| Nchannel | OFF | switch | OFF | switch | OFF | depletion | depletion |
| OUT | PU/Z | SC/PD | Z | PD | SC | SC | SC |

| Φ | L | L | H | H |
|---|---|---|---|---|
| Pchannel | OFF | OFF | switch | switch |
| ΦB | L | H | L | H |
| Nchannel | switch | OFF | switch | OFF |
| OUT | PD | Z | IN | PU |

TRISTATE GATE

CROSS-REFERENCE TO RELATED APPLICATIONS

This application is a national phase entry under 35 U.S.C. §371 of International Patent Application PCT/EP2012/075054, filed Dec. 11, 2012, designating the United States of America and published in English as International Patent Publication WO2013/087612 A1 on Jun. 20, 2013, which claims the benefit under Article 8 of the Patent Cooperation Treaty to the Europe Application Serial No. 11290575.7, filed Dec. 13, 2011, the disclosure of each of which is hereby incorporated herein in its entirety by this reference.

TECHNICAL FIELD

The present invention relates to the field of electronics, and more in particular to the field of tristate gates. More specifically, it relates to tristate gates comprising an output port and capable of outputting a high-impedance value on the output port by controlling the tristate gate.

BACKGROUND

Tristate gates allow their output port to assume a high impedance state in addition to the zero and one logic levels, effectively removing the effect of the output of the tristate gate from the circuit. This is useful in case when multiple circuits have to share a common medium, such as in the case of a plurality of I/O circuits driving a common bus.

BRIEF SUMMARY

An exemplary realization of a tristate gate 3000 is illustrated in FIG. 3A. As can be seen in FIG. 3A, tristate gate 3000 includes a NAND gate 3001, an NOR gate 3002, a P-type transistor 3200 and an N-type transistor 3300. Moreover, the tristate gate 3000 has the following input and output connections: input port 3100, output enable terminals 3700 and 3800, output port 3400, a power supply terminal 3500 and a ground terminal 3600.

The behavior of the tristate gate 3000 of FIG. 3A is explained with reference to FIG. 3B.

As can be seen in FIG. 3B, the value of the output signal OUT on output port 3400 of tristate gate 3000 depends on the value of signals $\Phi$ and $\Phi_B$ input into output enable terminals 3700 and 3800.

More specifically, when the signal $\Phi$ is equal to a logic value of 0 or, more generally, a low logic value represented in the table by "L," and the signal $\Phi_B$ is equal to a logic value of 1 or, more generally, a high logic value represented in the table by "H," the output signal OUT is equal to a high impedance value Z. This is due to the fact that the signal $\Phi$ being at a low logic value forces the NAND gate 3001 to output a high logic value independently of what the value of the signal IN is. Similarly, the $\Phi_B$ signal having a high logic value forces the output of the NOR gate 3002 to assume a low logic value independently of the value of the input signal IN. Accordingly, the P-type transistor 3200 has a high logic value on its gate while N-type transistor 3300 has a low logic value on its gate. This implies that both transistors 3200 and 3300 are closed, as indicated in the table by the keyword "OFF" in the lines Pchannel and Nchannel, and the output port 3400 is physically disconnected from both the power supply terminal 3500 and the ground terminal 3600. In such a manner, a high-impedance value on the signal OUT can be realized, independently of the value of the input signal IN on input port 3100.

Conversely, when the signal $\Phi$ is equal to a high logic value, while the signal $\Phi_B$ is equal to a low logic value, the output of both the NAND gate 3001 and NOR gate 3002 will depend on the value of the input signal IN. More specifically, if the signal IN has a low logic value, the output of NAND gate 3001 will be at a high logic value. Also, the output of NOR gate 3002 will be at a high logic value. Accordingly, the value of the OUT signal will be at a low logic value. On the other hand, when the IN signal is at a high logic value, the OUT signal will be at a high logic value. Accordingly, the OUT signal assumes the same value of the IN signal and the logic value input on input port 3100 is transferred to the output port 3400. This is indicated by the keyword "switch" for the N- and P-transistor channels, which indicates that the state of the transistors' channel will be determined according to the IN signal.

The remaining combinations of values for the signal $\Phi$ and $\Phi_B$ being, respectively, at logic values of low and low, and high and high, produce a signal OUT on output port 3400, which depends on the value of the signal IN on input port 3100. The details are given in the table of FIG. 3B, where "OFF" indicates that the respective transistor does not conduct, irrespectively of the value of the IN signal, while "switch" indicates that the transistor conducts, depending on the value of the IN signal. More specifically, for the combination of signals $\Phi$ and $\Phi_B$ being, respectively, low and low, the signal OUT assumes a value of low when the input signal IN has a value of low, while the signal OUT assumes a value of high impedance Z when the input signal TN has a logic value of high. Conversely, for the combination of signals $\Phi$ and $\Phi_B$ being, respectively, high and high, the output signal OUT assumes a value of high impedance value Z, when the input signal IN has a low logic value, while the output signal OUT assumes a high logic value when the input signal IN has a high logic value.

In other words, a Pull Down (PD in the figure) can be realized for the combination $\Phi$ and $\Phi_B$ being low and low. In this condition, the output can be only pulled-down by the buffer and cannot return to the high level by itself. This is useful when multiple outputs are connected to the same signal (only one active at once) and the return to high is realized by a single and common pull-up external to the buffer. This is widely used in practice as all signals are referenced from a common ground.

Symmetrically, a Pull UP (PU as shown in FIG. 3B) can be realized for the combination $\Phi$ and $\Phi_B$ being high and high. In this condition, the output can be only pulled-up by the buffer and cannot return to the low level by itself. This is useful when multiple outputs are connected to a same signal (only one active at once) and the return to low is realized by a single and common pull-down.

This is rarely used in practice as signals are referenced from power supply potentials (VDDs) that can be different from one function to the next.

Such a behavior makes it possible either to transfer the value of the input port 3100 to the output port 3400 or to decouple the input port 3100 from the output port 3400 by outputting a signal OUT corresponding to a high-impedance logic value Z.

Such a tristate buffer 3000 is widely employed on virtually all I/O drivers. In those cases, the transistors required are usually rather large, especially when compared to the remaining "core" transistors normally used in a semiconductor chip. Sometimes, the area destined to I/O circuitry can in fact account for more than 50% of the total area of the chip. Accordingly, any reduction in the number of transistors to be used in order to realize a tristate buffer achieves a significant impact in the size and costs of a semiconductor chip.

The present invention has been realized with such an aim. More specifically, the present invention allows the realization of a tristate buffer employing a reduced number of transistors, thereby drastically reducing the area consumption due to the tristate buffer.

More specifically, an embodiment of the present invention may relate to a tristate gate comprising an output port; and at least two transistors, each having at least a first and a second gate, configured such that a high-impedance value on the output port is set by controlling the threshold voltage of at least one of the transistors.

Thanks to such approach, it is possible to advantageously realize a tristate buffer using a reduced number of transistors.

In some embodiments, the transistors can be configured such that the high-impedance value on the output port is set by controlling the threshold voltages of the at least two transistors.

Thanks to such approach, it is possible to advantageously realize a tristate buffer using a reduced number of transistors.

In some embodiments, the threshold voltages of the transistors can be controlled independently of each other.

Thanks to such approach, it is possible to advantageously operate the tristate gate so as to output different values on the output port.

In some embodiments, the transistors can be SOI transistors.

Thanks to such approach, it is possible to advantageously realize double-gate transistors.

In some embodiments, the threshold voltage can be controlled by means of the back gate.

Thanks to such approach, it is possible to advantageously control the threshold voltage when the transistors are SOI transistors.

In some embodiments, the transistors can be fully depleted SOI transistors.

Thanks to such approach, it is possible to advantageously control the threshold voltage of the transistors with higher precision and lower voltages on the back gate.

In some embodiments, the transistors can be Finfet transistors.

Thanks to such approach, the tristate gate can be realized without the use of SOI substrates.

In some embodiments, the transistors can comprise a first transistor and a second transistor; and the first transistor can be connected between a power supply terminal and the output port and the second transistor can be connected between a ground terminal and the output port.

Thanks to such approach, it is possible to advantageously connect the transistors so as to realize the tristate functionality with only two transistors.

In some embodiments, the tristate gate can further comprise an input port connected to the first gate of the transistors.

Thanks to such approach, it is possible to advantageously realize a digital tristate gate.

In some embodiments, the tristate gate can further comprise an input port connected to the first gate of one of the transistors.

Thanks to such approach, it is possible to advantageously realize an analog tristate gate.

In some embodiments, the tristate gate can further comprise a control port connected to the first gate of one of the transistors different from the transistor whose first gate is connected to the input port.

Thanks to such approach, it is possible to advantageously control the operation of an analog tristate gate.

In some embodiments, the control port can be configured to enable or disable a signal path from the input port to the output port.

Thanks to such approach, it is possible to advantageously operate an analog tristate gate so as to transmit or not the analog signal through the gate.

An embodiment of the present invention may further relate to a circuit comprising a tristate gate according to any of the previous embodiments.

Thanks to such approach, it is possible to advantageously integrate the tristate gate into electrical circuits.

An embodiment of the present invention may further relate to a semiconductor structure, in particular, a semiconductor wafer and/or a semiconductor chip and/or a semiconductor component, implementing the circuit according to the previous embodiment.

Thanks to such approach, it is possible to advantageously realize the circuit implementing a tristate gate according to the present invention.

An embodiment of the present invention may further relate to a method for driving a tristate gate comprising an output port and at least two transistors, each having at least a first and a second gate, the method comprising setting a high-impedance value on the output port by controlling the threshold voltage of at least one of the transistors.

Thanks to such approach, it is possible to advantageously control a tristate gate realized with a reduced number of transistors.

BRIEF DESCRIPTION OF THE DRAWINGS

The invention will be described in more detail, by way of example, hereinafter using advantageous embodiments and with reference to the drawings. The described embodiments are only possible configurations in which the individual features may, however, as described above, be implemented independently of each other or may be omitted. Equal elements illustrated in the drawings are provided with equal reference signs. Parts of the description relating to equal elements illustrated in the different drawings may be omitted. In the drawings:

FIG. 1B illustrates a schematic table resuming the operation of the tristate buffer 1000 of FIG. 1A;

DETAILED DESCRIPTION

Figure 1A:
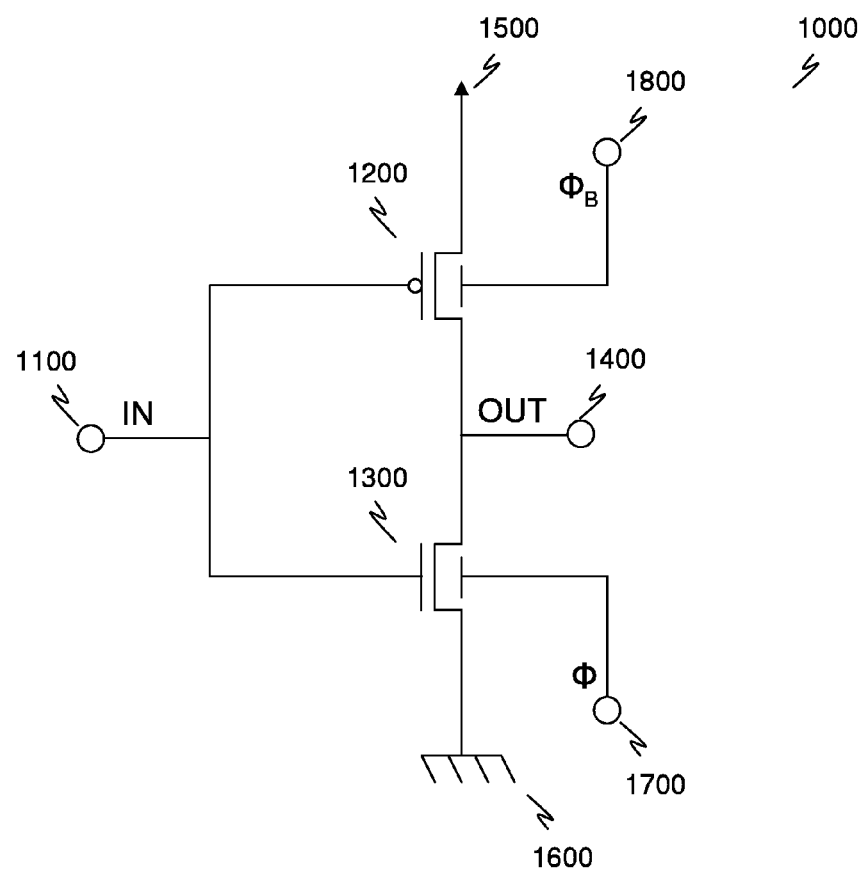
FIG. 1A illustrates a schematic drawing of a tristate buffer 1000 in accordance with an embodiment of the present invention.

As can be seen in FIG. 1A, a tristate buffer 1000, in accordance with an embodiment of the present invention, includes an input port 1100, p-type transistor 1200 and n-type transistor 1300, power supply terminal 1500, ground terminal 1600, output port 1400, and output enable terminals 1700 and 1800.

More specifically, a connection is realized between the input port 1100 and the gates of both the transistors 1200 and 1300. Transistor 1200 is a P-type SOI transistor. Transistor 1300 is an N-type SOI transistor. Transistors 1200 and 1300 may be partially depleted SOI transistors (PDSOI), or fully depleted SOI transistors (FDSOI). The drain of both transistors 1200 and 1300 is connected to the output port 1400. The source of p-type transistor 1200 is connected to the power supply terminal 1500 while the source of n-type transistor 1300 is connected to the ground terminal 1600. The body voltage of p-type transistor 1200 can be controlled via a back-gate bias by using output enable terminal 1800. Similarly, the body voltage of n-type transistor 1300 can be controlled by means of output enable terminal 1700.

The two transistors 1200 and 1300 are double-gate transistors in which each gate can be controlled independently of the other.

FIG. 1B illustrates a schematic table of the behavior of the tristate gate 1000 of FIG. 1A.

As can be seen in the table, in each column the values of the signals $\Phi_B$, $V_{THP}$, Pchannel, $\Phi$, $V_{THN}$ Nchannel and OUT are reported. More specifically, the signal $\Phi_B$ corresponds to the signal input to the output enable terminal 1800 controlling the body voltage of the p-type transistor 1200. The signal $V_{THP}$, corresponds to the absolute value of the threshold voltage of the p-type transistor 1200 and is a function of the back-gate bias voltage $\Phi_B$. The signal Pchannel indicates the status of the channel of P transistor 1200 with respect to the switching of the IN signal on port 1100. The signal D corresponds to the signal input to the output enable terminal 1700 controlling the body voltage of the n-type transistor 1300. The signal $V_{THN}$, corresponds to the absolute value of the threshold voltage of the n-type transistor 1300 and is a function of the back-gate bias voltage 1. The signal Nchannel indicates the status of the channel of N transistor 1300 with respect to the switching of the IN signal on port 1100. The signal OUT corresponds to the signal on the output port 1400.

For each of the input signals among the abovementioned signals, a value is given among "H," "L," "SC," "Z," and "IN," "Very L" and "Very H." More specifically, the signal value "H" corresponds to a high logic value, the signal value "L" corresponds to a low logic value. Similarly, the signal value "Very H" corresponds to a very high logic value, enough for turning the P transistor 1200 in depletion mode, while the signal value "Very L" corresponds to a very low logic value, enough for turning the N transistor 1300 in depletion mode. The signal value "Z" corresponds to a high-impedance signal. The signal value "IN" corresponds to the inverted logic signal input on input port 1100. The signal value "SC" corresponds to a signal resulting from the short circuit between the power supply terminal 1500 and the ground terminal 1600 via transistors 1200 and 1300. For instance, assuming that the series resistance of the transistors 1200 and 1300 is the same, the voltage value corresponding to the signal "SC" will be half of the difference between the voltage of the power supply terminal 1500 and the voltage of the ground terminal 1600.

In this context, the values "H" and "L" are to be interpreted as, respectively, "high enough" and "low enough" to modify the value of the threshold voltage of the transistors 1200 and 1300 in such a way that the behavior of the transistors 1200 and 1300 is dictated by the application of the back-gate bias to the body. In other words, for instance, if the signal $\Phi$ has a high voltage value "H," then the threshold voltage of the n-type transistor 1300 $V_{THN}$ will be lowered and the transistor will be conducting or not depending on the value of the signal IN applied to the gate terminal of transistor 1300, as indicated by the keyword "switch." Symmetrically, for instance, if the signal 1 has a low voltage value "L," then the threshold voltage of the n-type transistor 1300 $V_{THN}$ will be increased and the transistor will be open, i.e., not conducting, independently of the value of the signal IN applied to the gate terminal of transistor 1300, as indicated by the keyword "OFF."

Furthermore, the following signal values are given to the signals $V_{THP}$ and $V_{THN}$: "high" and "low." More specifically, the signal value corresponding to "high" signifies a high-voltage value while the voltage value corresponding to the signal "low" corresponds to a low voltage value. In this context, the terms "high" and "low" are to be interpreted as respectively "high enough" and "low enough" make the transistors 1200 and 1300 behave on the basis of the voltage value on the back gate. For instance, if the signal $\Phi_B$ has a low voltage value "L," then the threshold voltage of the p-type transistor 1200 $V_{THP}$ will be lowered and the transistor will be conducting or not depending on the value of the signal IN applied to the gate terminal of transistor 1200, as indicated by the keyword "switch." Symmetrically, for instance, if the signal $\Phi_B$ has a high voltage value "H," then the threshold voltage of the p-type transistor 1200 $V_{THP}$ will be increased and the transistor will be open, i.e., not conducting, independently of the value of the signal IN applied to the gate terminal of transistor 1200, as indicated by the keyword "OFF."

It is to be noted that the signals $V_{THP}$ and $V_{THN}$ are intended as absolute values. Accordingly, when the threshold voltage is indicated as having a low value for the n-type transistor 1300, this implies that the transistor 1300 is closed at a lower gate terminal voltage with respect to the case in which the threshold voltage is indicated as having a high value. Similarly, when the threshold voltage $V_{THP}$ of p-type transistor 1200 is indicated as being low, this implies that the p-type transistor 1200 is closed (i.e., conducting), at a higher gate terminal voltage with respect to the case in which the threshold voltage is indicated as having a high value.

Figures 3A, 3B:
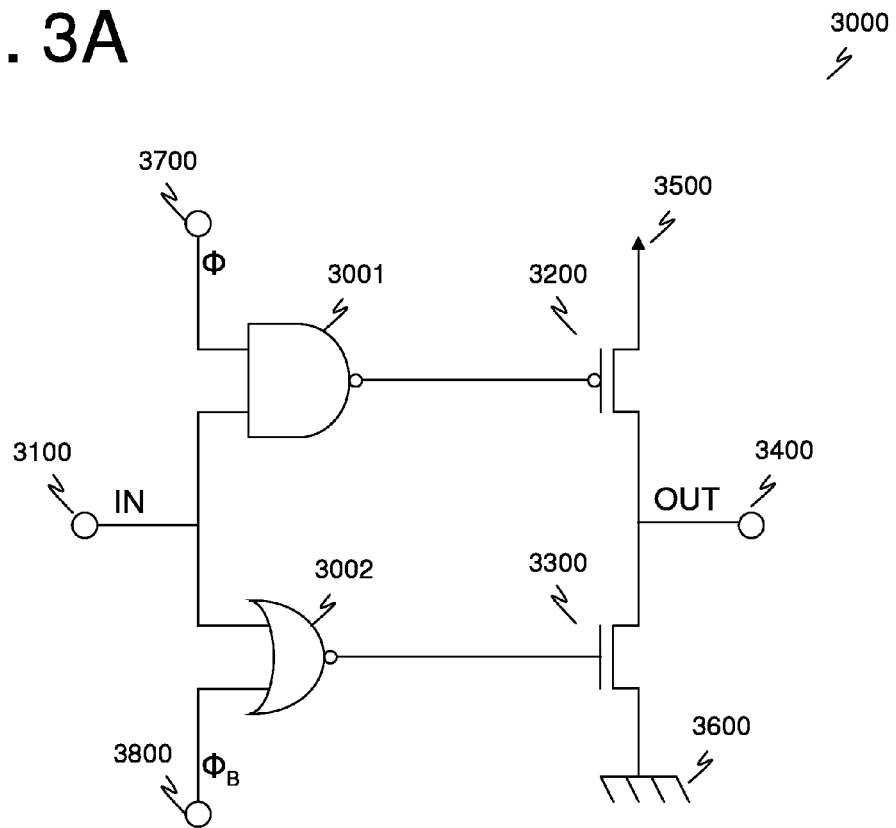
FIG. 3A illustrates a schematic drawing of a tristate buffer 3000 in accordance with the state of the art.
FIG. 3B illustrates a schematic table resuming the operation of the tristate buffer 3000 of FIG. 3A.

In general, the abovementioned behavior can be obtained by opening, i.e., setting in a non-conducting state, any of the transistors by setting its threshold voltage over VDD when the back gate is at an appropriate level. This case is indicated by the keyword "OFF" in FIGS. 3B and 1B.

For instance, on Nchannel, setting the voltage $\Phi$ at 0v increases the threshold voltage to a value that can be chosen at 0.8V-1.0V. With a VDD of 0.6-7V, this implies that the transistor cannot be made conducting, independently on what logic value is applied on the gate. On the other hand, applying a high voltage "H" on signal will lower the threshold voltage in the range of 0.3V. With the same VDD at 0.6V-0.7V, the transistor that can be turned in a conducting or non-conducting state according to the top gate logic value, as in usual enhancement transistors. The same applies on the P transistor by symmetry.

The above numerical values are an example only and the present invention is not limited thereto. The voltage amplitude on the back gate that makes the transistor acts, as described above, depends on technological parameters such as, but not limited to, thicknesses of Silicon film, the top gate and the back gate. In general, the back gate voltage can be in the range of VDD, or a little more on Fully Depleted SOI technology.

As can be seen from the table of FIG. 1B, due to the different possible combinations of the various input signals, the output signal OUT can assume different values.

In particular, columns 1010 and 1011 result, respectively, in a Pull Up "PU" and Pull Down "PD" case. Column 1030 results in the output being the negated version of the Input signal IN. Column 1020 results in the output being at a high impedance value "Z." Columns 1040, 1041 and 1042 may result in a Short Circuit "SC," in some cases also depending on the input on signal IN. Therefore, depending on the application, these combinations of signals may be forbidden.

As can be seen in the table, with the configuration of signals given in column 1020, the output signal OUT assumes a high-impedance value "Z" irrespective of the value of the input signal IN on input port 1100. More specifically, the combination that provides such an effect consists of having a high voltage level "H" for the signal $\Phi_B$ and a low voltage level "L" for the signal $\Phi$. In fact, the high voltage level for the signal $\Phi_B$ has the effect of increasing the absolute value of the threshold voltage $V_{THP}$ of p-type transistor 1200 to a high level "high." While the low value "L" for the signal CD has the effect of increasing the absolute value of the threshold voltage $V_{THN}$ of n-type transistor 1300 to a high level "high." Accordingly, since both the threshold voltage of transistor 1200 and of transistor 1300 are increased to such a value "high" where the transistors are open, i.e., non-conducting, irrespective of the value of the input signal IN, the output signal OUT on output port 1400 is disconnected from both the power supply terminal 1500 and the ground terminal 1600, irrespective of the value of the input signal IN on input port 1100. In such a manner, a reliable high-impedance value can be achieved on output port 1400 by using only the back-gate bias of the body terminals of transistors 1200 and 1300.

On the other hand, when the values of the signals $\Phi_B$ and $\Phi$ are respectively set to "L" and "H" such that the transistors operate according to the gate terminal voltage, as indicated by the keyword "switch," such as in column 1030, the tristate gate 1000 acts as an inverter and the output signal OUT corresponds to the logic inversion of the input signal IN.

The Pull Up "PU" of column 1010 can be realized for the combination $\Phi_B$ and $\Phi$ being respectively at "L" and "L." In this condition, the output can be only pulled-up by tristate gate 1000 and cannot return to the low level by itself, unless the values of signals $\Phi_B$ and $\Phi$ are changed. In this case, for instance, the return to a low value on the OUT signal can be realized by a single and common pull-down external to the buffer such as, for instance, a resistor.

Symmetrically, the Pull Down "PD" of column 1011 can be realized for the combination $\Phi_B$ and $\Phi$ being respectively at "H" and "H." In this condition, the output can be only pulled-down by tristate gate 1000 and cannot return to the high level by itself, unless the values of signals $\Phi_B$ and $\Phi$ are changed. In this case, for instance, the return to a high value on the OUT signal can be realized by a single and common pull-up external to the buffer such as, for instance, a resistor.

Figures 2A, 2B:
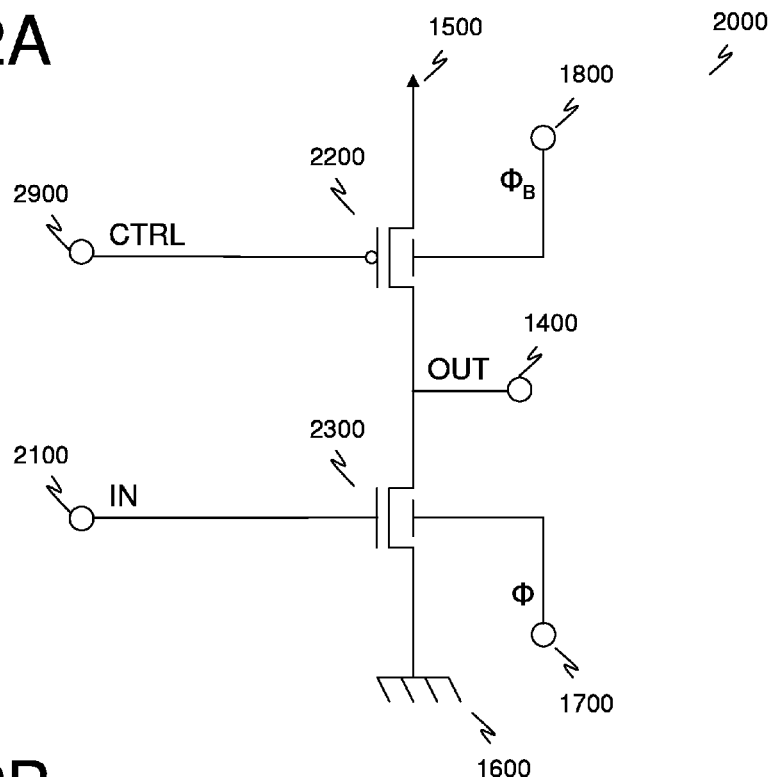
FIG. 2A illustrates a schematic drawing of a tristate buffer 2000 in accordance with an embodiment of the present invention.
FIG. 2B illustrates a schematic table resuming the operation of the tristate buffer 2000 of FIG. 2A.

As can be seen in FIG. 2A, a tristate buffer 2000 in accordance with a further embodiment of the present invention includes an input port 2100, a control port 2900, p-type transistor 2200 and n-type transistor 2300, power supply terminal 1500, ground terminal 1600, output port 1400, and output enable terminals 1700 and 1800.

More specifically, a connection is realized between the input port 2100 and the gate of the n-type transistor 2300. The remaining connections are similar to the corresponding connections in FIG. 1A.

FIG. 2B illustrates a schematic table of the behavior of the tristate gate 2000 of FIG. 2A.

The meaning of the signal values in the table are similar to those of table of FIG. 1B. In addition, the table of FIG. 2B includes a row for the value of the control signal CTRL. For ease of representation, the control signal CTRL has been assigned both low logic value "0" and high logic value "1" in each column. When the behavior of the gate is different, depending on whether the CTRL signal is at "0" or "1," this is indicated in each column by providing more than one value, respectively, corresponding to CTRL being at "0" or "1." For instance, in column 2010, if CTRL is "0," then P transistor 2200 is made conducting as indicated by "switch on" or non-conducting as indicated by "switch off" in line "Pchannel." This results in OUT signal having a respective Pull Up value "PU," when CTRL is set at "0" value, or high impedance "Z," when CTRL is set at "1."

As can be seen, thanks to the configuration of tristate gate 2000, the gate acts as an analog tristate gate.

In particular, as indicated in column 2030, the tristate function can be implemented by setting signals $\Phi_B$ and $\Phi$ at "H" and "L" values, respectively. In this case, the values of signals $\Phi_B$ and $\Phi$ force both the P and N transistor to be always "OFF," i.e., non-conducting, independently on the value of the CTRL signal or the IN signal.

Columns 2040, 2041 and 2042 may result in a Short Circuit "SC," in some cases also depending on the input on signal IN. Similarly, the signal combination of column 2021, when CTRL is set at "0" also results in a short circuit. The signal combinations corresponding to these columns can, therefore, be forbidden, depending on the applications.

Column 2021 when CTRL is set at "1" can be used in order to implement a Pull Down "PD" on the output. Similarly, column 2020 can be used in order to implement a Pull Down "PD" function.

Accordingly, the tristate gate 2000 can act as an analog tristate port, with a reduced number of transistors.

Furthermore, although tristate gates 1000 and 2000 have been described with respect to SOI technology for the transistors 2200 and 2300, the present invention is not limited to SOI technology. Alternatively, the two transistors could be realized with any technology that provides control of the body voltage of the transistor by more than one independent gate, such as independent double-gate or triple-gate, or multiple-gate transistors. For instance, in the case of double-gate technology, one of the gates could be connected as the front gate of transistors 1200, 2200, 1300 and 2300, while the other gate could be connected as the back gate of transistors 1200, 2200, 1300 and 2300.

Alternatively, or in addition, the invention could also be implemented by using Finfets, with at least two independent gates, for some or all of the transistors. In this case, one of the two gates could act as a top gate or front gate, as described above, while the other gate could act as a bottom gate or back gate, as described above.

All previously discussed embodiments are not intended as limitations but serve as examples illustrating features and advantages of the invention. It is to be understood that some or all of the abovedescribed features can also be combined in different ways.

The invention claimed is:

1. A tristate gate, comprising:
an output port;
an n-type transistor and a p-type transistor, each of the n-type transistor and the p-type transistor having at least a first gate and a second gate, each of the n-type transistor and the p-type transistor having a drain electrode connected to the output port, the second gate of the n-type transistor connected to a first output enable terminal and the second gate of the p-type transistor connected to a second output enable terminal different from the first output enable terminal, the n-type transistor and the p-type transistor configured such that a high-impedance value (Z) on the output port is set by controlling threshold voltages of the n-type transistor and the p-type transistor via their respective second gates, wherein the threshold voltages of the n-type transistor and the p-type transistor are controlled independently of each other;

an input port connected to the first gate of the n-type transistor; and a control port connected to the first gate of the p-type transistor, wherein the control port is different from the input port and is configured to enable or disable a signal path from the input port to the output port.

2. The tristate gate according to claim 1, wherein the n-type transistor and the p-type transistor are SOI transistors.

3. The tristate gate according to claim 1, wherein the n-type transistor and the p-type transistor are SOI transistors.

4. The tristate gate according to claim 3, wherein the second gates of the n-type transistor and the p-type transistor are back gates.

5. The tristate gate according to claim 3, wherein the n-type transistor and the p-type transistor are fully depleted SOI transistors.

6. The tristate gate according to claim 3, wherein the n-type transistor and the p-type transistor are Finfet transistors.

7. The tristate gate according to claim 3, wherein the p-type transistor is connected between a power supply terminal and the output port, and the n-type transistor is connected between a ground terminal and the output port.

8. The tristate gate according to claim 1, wherein the n-type transistor and the p-type transistor are Finfet transistors.

9. The tristate gate according to claim 1, wherein the p-type transistor is connected between a power supply terminal and the output port, and the n-type transistor is connected between a ground terminal and the output port.

10. A circuit comprising a tristate gate according to claim 1.

11. A semiconductor structure including a circuit having at least one tristate gate, the tristate gate comprising:
an output port;
an n-type transistor and a p-type transistor, each of the n-type transistor and the p-type transistor having at least a first gate and a second gate, each of the n-type transistor and the p-type transistor having a drain electrode connected to the output port, the second gate of the n-type transistor connected to a first output enable terminal and the second gate of the p-type transistor connected to a second output enable terminal different from the first output enable terminal, and the n-type transistor and the p-type transistor configured such that a high-impedance value (Z) on the output port is set by controlling threshold voltages of the n-type transistor and the p-type transistor via their respective second gates, wherein the threshold voltages of the n-type transistor and the p-type transistor are controlled independently of each other;

an input port connected to the first gate of the n-type transistor; and a control port connected to the first gate of the p-type transistor, wherein the control port is different from the input port and is configured to enable or disable a signal path from the input port to the output port.

12. The semiconductor structure according to claim 11, wherein the n-type transistor and the p-type transistor are SOI transistors.

13. The semiconductor structure according to claim 12, wherein the second gates of the n-type transistor and the p-type transistor are back gates.

14. The semiconductor structure according to claim 11, wherein the n-type transistor and the p-type transistor are fully depleted SOI transistors.

* * * * *

UNITED STATES PATENT AND TRADEMARK OFFICE
CERTIFICATE OF CORRECTION

PATENT NO.       : 9,479,174 B2
APPLICATION NO.  : 14/364923
DATED            : October 25, 2016
INVENTOR(S)      : Richard Ferrant Page 1 of 1

It is certified that error appears in the above-identified patent and that said Letters Patent is hereby corrected as shown below:

In the Specification
Column 2, Line 31,   change "signal TN has" to --signal IN has--
Column 5, Line 33,   change "signal D corresponds" to --signal Φ corresponds--
Column 5, Line 38,   change "voltage 1." to --voltage Φ.--
Column 6, Line 6,    change "signal 1" to --signal Φ--
Column 6, Line 54,   change "signal will" to --signal Φ will--
Column 7, Line 22,   change "signal CD" to --signal Φ--

Signed and Sealed this
Seventh Day of March, 2017

Michelle K. Lee
*Director of the United States Patent and Trademark Office*